(12) United States Patent
Jiang et al.

(10) Patent No.: US 11,329,113 B2
(45) Date of Patent: May 10, 2022

(54) ARRAY SUBSTRATE, DISPLAY PANEL, DISPLAY DEVICE AND MANUFACTURING METHOD OF ARRAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventors: Mingxiao Jiang, Beijing (CN); Dan Wang, Beijing (CN); Yun Qiu, Beijing (CN); Xiao Sun, Beijing (CN); Weipin Hu, Beijing (CN); Qianqian Bu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 186 days.

(21) Appl. No.: 16/642,256

(22) PCT Filed: Nov. 12, 2018

(86) PCT No.: PCT/CN2018/115047
§ 371 (c)(1),
(2) Date: Feb. 26, 2020

(87) PCT Pub. No.: WO2020/097758
PCT Pub. Date: May 22, 2020

(65) Prior Publication Data
US 2021/0151527 A1 May 20, 2021

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3227* (2013.01); *H01L 51/5271* (2013.01); *H01L 51/56* (2013.01); *H01L 2227/323* (2013.01)

(58) Field of Classification Search
CPC ............. H01L 27/3246; H01L 27/3227; H01L 2227/323; H01L 51/5271; H01L 51/56
(Continued)

(56) References Cited

U.S. PATENT DOCUMENTS 5,998,782 A   12/1999   Koyama et al.
2011/0036712 A1 *  2/2011   Kusaka ............ A61B 5/15136
                                                    204/403.01

(Continued)

FOREIGN PATENT DOCUMENTS

CN      106033800 A      10/2016
CN      106887212 A       6/2017
(Continued)

OTHER PUBLICATIONS

PCT International Search Report, Application No. PCT/CN2018/115047, dated Aug. 8, 2019, 6 pages: with English translation.
(Continued)

*Primary Examiner* — Dzhung Tran
(74) *Attorney, Agent, or Firm* — Armstrong Teasdale LLP (57) ABSTRACT

The disclosure relates to an array substrate, a display panel, a display device, and a method for manufacturing the array substrate. The array substrate includes a first substrate, a light emitting device on the first substrate, the light emitting device including a first electrode, a light emitting layer, and a second electrode sequentially disposed in a direction away from the first substrate, wherein the first electrode is transparent, and wherein the second electrode is reflective, an opaque portion between the first substrate and the light emitting device, wherein a projection of the light emitting
(Continued)

device on the first substrate partially overlap with a projection of the opaque portion on the first substrate, and a reflective member between the opaque portion and the light emitting layer.

12 Claims, 5 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2011/0109532 | A1* | 5/2011 | Choi | H01L 27/1259 345/76 |
| 2011/0191042 | A1* | 8/2011 | Chaji | G09G 3/006 702/64 |
| 2013/0188085 | A1* | 7/2013 | Shim | H01L 27/14612 348/333.08 |
| 2016/0104422 | A1* | 4/2016 | Kishi | G09G 3/006 345/205 |
| 2016/0126381 | A1* | 5/2016 | Wang | G02B 6/122 257/429 |
| 2016/0247450 | A1* | 8/2016 | Liu | G09G 3/3258 |
| 2017/0012086 | A1 | 1/2017 | Kim et al. | |

FOREIGN PATENT DOCUMENTS

| | | |
|---|---|---|
| GN | 105304679 A | 2/2016 |
| JP | 2007322780 A | 12/2007 |

OTHER PUBLICATIONS

PCT Written Opinion, Application No. PCT/CN2018/115047, dated Aug. 8, 2019, 4 pages: with English translation of relevant part.
China First Office Action, Application No. 201880001987.5, dated Jan. 21, 2021, 21 pps.: with English translation.
China Second Office Action, Application No. 201880001987.5, dated Jul. 15, 2021, 21 pps.: with English translation.

* cited by examiner

ARRAY SUBSTRATE, DISPLAY PANEL, DISPLAY DEVICE AND MANUFACTURING METHOD OF ARRAY SUBSTRATE

CROSS REFERENCE TO RELATED APPLICATIONS

This patent application is a National Stage Entry of PCT/CN2018/115047 filed on Nov. 12, 2018, the disclosure of which is incorporated by reference herein in its entirety as part of the present application.

BACKGROUND

The disclosure relates to the field of display technology. Specifically, it relates to an array substrate, a display panel, a display device, and a method for manufacturing the array substrate.

OLED display devices are widely researched and applied as next-generation displays due to their advantages such as low thinness, low power consumption, high contrast, and high color gamut. Compared with liquid crystal display devices, another advantage of OLED display devices are that they do not require backlighting.

BRIEF DESCRIPTION

Embodiments of the present disclosure provide an array substrate, a display panel, a display device, and a method for manufacturing the array substrate.

The array substrate according to some embodiments of the present disclosure includes a first substrate, a light emitting device on the first substrate, the light emitting device including a first electrode, a light emitting layer, and a second electrode sequentially disposed in a direction away from the first substrate, wherein the first electrode is transparent, and wherein the second electrode is reflective, an opaque portion between the first substrate and the light emitting device, wherein a projection of the light emitting device on the first substrate partially overlaps with a projection of the opaque portion on the first substrate, and a reflective member between the opaque portion and the light emitting layer.

In some embodiments, the reflective member has a first surface facing the first substrate and a second surface away from the first substrate, wherein at least one of the first surface and the second surface is in contact with the first electrode.

In some embodiments, the reflective component includes a reflective metal.

In some embodiments, the second electrode includes a first portion and a second portion, wherein a projection of the first portion on the first substrate at least partially overlaps with a projection of the opaque portion on the first substrate, a projection of the second portion on the first substrate does not overlap with a projection of the opaque portion on the first substrate, wherein the first portion can partially transmit light from the light emitting layer.

In some embodiments, the first portion and the second portion include a same material, and a thickness of the first portion is less than a thickness of the second portion.

In some embodiments, the first portion and the second portion include different materials.

In some embodiments, the thickness of the first portion does not exceed 20 nm.

In some embodiments, a material of the second electrode includes at least one of the following: magnesium, silver, aluminum, or a mixture thereof.

In some embodiments, the first electrode includes a transparent conductive material.

In some embodiments, the opaque portion includes a thin film transistor, and the array substrate further includes a planarization layer between the thin film transistor and the first electrode, and a pixel definition layer on a surface of the planarization layer away from the first substrate, the pixel definition layers being located on both sides of the first electrode to define a pixel region of the array substrate.

Some embodiments of the present disclosure also provide a display panel. The display panel includes the array substrate described above and a cover plate disposed opposite to the array substrate.

In some embodiments, the cover plate includes a second substrate and a light detector disposed on a surface of the second substrate facing the array substrate, a projection of the light detector on the first substrate at least partially overlaps with a projection of the first portion of the second electrode on the first substrate, wherein a projection of the first portion on the first substrate at least partially overlaps with a projection of the opaque portion on the first substrate, and wherein the first portion is capable of partially transmitting light from the light emitting layer.

In some embodiments, the light detector includes a PIN photoelectric conversion device.

Some embodiments of the present disclosure also provide a display device. The display device includes a display panel as described above, a data processing unit, configured to generate a control signal according to a brightness of the light emitting device detected by the light detector, and a light emitting control unit, configured to adjust a brightness of the light emitting device according to the control signal.

Some embodiments of the present disclosure also provide a method for manufacturing an array substrate. The method includes providing a first substrate, forming an opaque portion on the first substrate, and forming a light emitting device and a reflective member on the opaque portion, wherein a projection of the light emitting device on the first substrate partially overlaps with a projection of the opaque portion on the first substrate, and wherein the light emitting device includes a first electrode, a light emitting layer, and a second electrode sequentially disposed in a direction away from the first substrate, wherein the first electrode is transparent, the second electrode is reflective, and wherein, the reflective member is located between the opaque portion and the light emitting layer.

In some embodiments, forming a light emitting device and a reflective member on the opaque portion includes forming the first electrode on the opaque portion, forming the reflective member on the first electrode, forming the light emitting layer on the reflective member, and forming the second electrode on the light emitting layer.

In some embodiments, forming a light emitting device and a reflective member on the opaque portion includes forming the reflective member on the opaque portion, forming the first electrode on the reflective member, forming the light emitting layer on the first electrode, and forming the second electrode on the light emitting layer.

In some embodiments, forming a light emitting device and a reflective member on the opaque portion includes forming the reflective member on the opaque portion, forming the first electrode on the reflective member, forming the light emitting layer on the first electrode, and forming the second electrode on the light emitting layer.

In some embodiments, forming a light emitting device and a reflective member on the opaque portion includes forming a first sub-layer of a first electrode on the opaque portion, forming the reflective member on the first sub-layer, forming a second sub-layer of the first electrode on the reflective member, forming the light emitting layer on the second sub-layer, and forming the second electrode on the light emitting layer.

In some embodiments, the reflective component includes a reflective metal.

In some embodiments, forming the second electrode of the light emitting device includes forming a reflective conductive layer on the light emitting layer, the reflective conductive layer including a first portion and a second portion, wherein a projection of the first portion on the first substrate at least partially overlaps with a projection of the opaque portion on the first substrate, and a projection of the second portion on the first substrate does not overlap with a projection of the opaque portion on the first substrate, and thinning the first portion.

In some embodiments, forming the second electrode of the light emitting device includes forming a first reflective conductive layer on the light emitting layer, and forming a second reflective conductive layer on the first reflective conductive layer, wherein a projection of the second reflective conductive layer on the first substrate does not overlap with a projection of the opaque portion on the first substrate.

In some embodiments, forming the second electrode of the light emitting device includes forming a first portion and a second portion on the light emitting layer, wherein a material of the first portion is different with a material of the second portion, and a projection of the first portion on the first substrate at least partially overlaps with a projection of the opaque portion on the first substrate, and wherein a projection of the second portion on the first substrate does not overlap with a projection of the opaque portion on the first substrate, wherein the first portion is capable of partially transmitting light from the light emitting layer.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

In order to make the technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

When introducing elements of the disclosure and its embodiments, the references "a", "an", "the" and "said" are generally inclusive of the plurals of the respective terms. Similarly, the words "comprise", "comprises", and "comprising" are to be interpreted inclusively rather than exclusively.

For purposes of the description, hereinafter, the terms "upper", "lower", "right", "left", "vertical", "horizontal", "top", "bottom", and derivatives thereof shall relate to the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "contact" means that a first element, such as a first structure, and a second element, such as a second structure, are connected with or without any intermediary elements at the interface of the two elements.

Currently, bottom-emitting OLED technology is relatively mature and widely used in various types of OLED displays, but a significant problem with bottom-emitting is the low aperture ratio. For example, compared with LCD, an OLED pixel driving circuit is much more complicated, and the non-opening area occupied by the pixel driving circuit is larger.

In addition, in terms of brightness optical compensation, a related technology is to implement pixel-level brightness detection through an external industrial-grade CCD. This solution requires an additional external optical compensation system. On the one hand, the accuracy is poor. On the other hand, detection compensation can only be performed during the manufacturing stage of the display screen. Another related technique is an internal optical compensation solution. Specifically, a photosensitive sensor is fabricated in the array substrate. However, this solution not only greatly increases the pixel circuit area and causes the pixel aperture ratio to decrease drastically, but also needs to design a complicated optical path for the sensor affecting the light transmittance.

Figure 1:
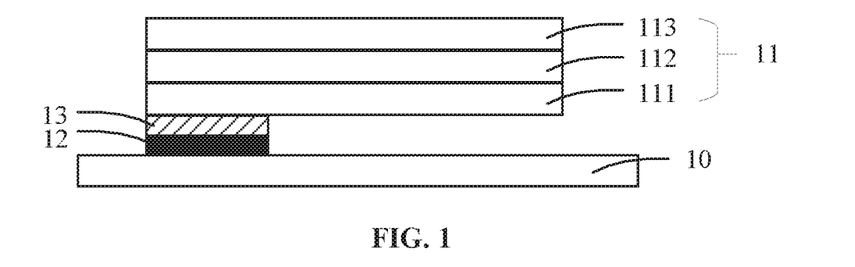
FIG. 1 is a schematic view of an array substrate according to an embodiment of the present disclosure.

FIG. 1 is a schematic view of an array substrate according to an embodiment of the present disclosure. As shown in FIG. 1, an array substrate according to an embodiment of the present disclosure includes a first substrate 10, a light emitting device 11 on the first substrate 10, and an opaque portion 12 between the first substrate 10 and the light emitting device 11. As shown in FIG. 1, the light emitting device 11 includes a first electrode 111, a light emitting layer 112, and a second electrode 113 that are sequentially disposed in a direction away from the first substrate 10. As shown in FIG. 1, the array substrate further includes a reflective member 13 between the opaque portion 12 and the light emitting layer 112. The first electrode 111 may be transparent, and the second electrode 113 may be reflective. A projection of the light emitting device 11 on the first substrate 10 partially overlap with a projection of the opaque portion 12 on the first substrate 10.

The "opaque portion" herein refers to a component that prevents light emitted from the light emitting layer from being emitted. For example, the opaque portion includes a pixel driving member having a thin film transistor or the like for driving a light emitting device. Since the pixel driving component is generally opaque, it causes a part of light emitted from the light emitting layer corresponding to the pixel area component to be blocked by the pixel driving component.

Figure 2:
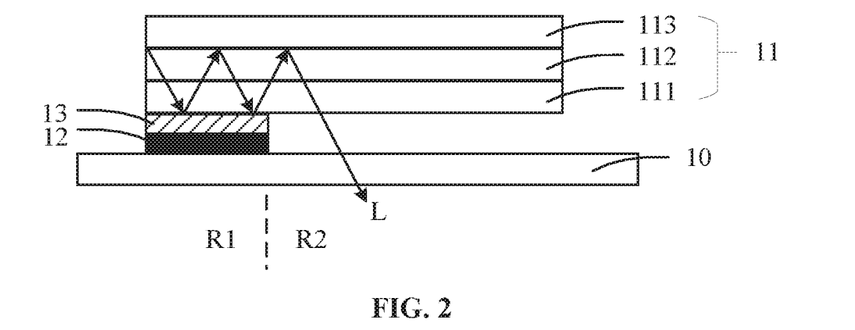
FIG. 2 is a schematic view of a part of an optical path of an array substrate according to an embodiment of the present disclosure.

FIG. 2 is a schematic view of a part of an optical path of an array substrate according to an embodiment of the present disclosure. As shown in FIG. 2, through the cooperation of the first electrode 111 and the reflective member 13, light generated by the light emitting layer 112 in the light-shielding region R1 of the array substrate can be emitted from the light-transmitting region R2 of the array substrate. Therefore, the array substrate according to the embodiments of the present disclosure can effectively utilize light generated by the light emitting layer 112.

The reflective member 13 has a first surface S131 facing the first substrate 10 and a second surface S132 facing away from the first substrate 10. At least one of the first surface S131 and the second surface S132 is in contact with the first electrode 111.

Figure 3A:
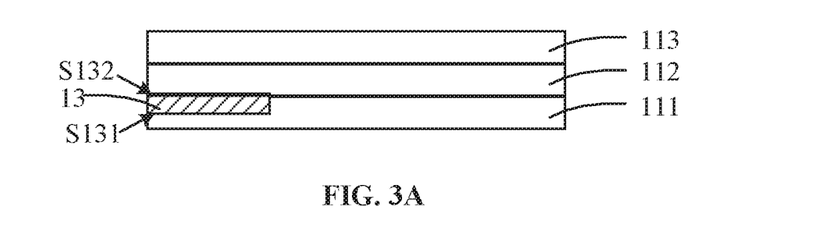
FIGS. 3A-3C are partial schematic views of an array substrate according to an embodiment of the present disclosure.
Figure 3B:
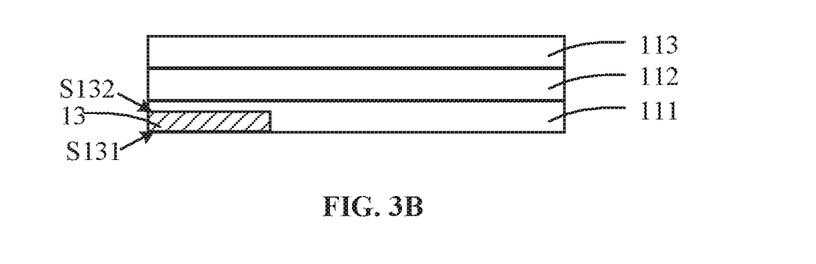
Figure 3C:
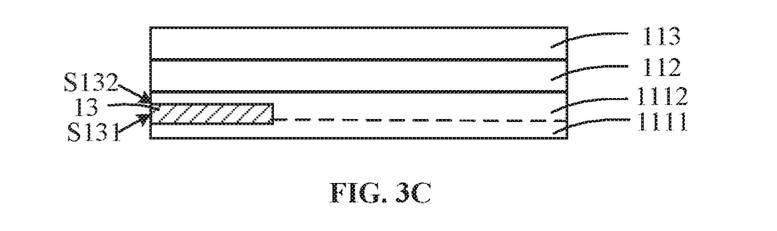

FIGS. 3A-3C are partial schematic views of an array substrate according to an embodiment of the present disclosure. As shown in FIG. 3A, the first surface S131 of the reflective member 13 is in contact with the first electrode 111 and the second surface S132 is not in contact with the first electrode 111. That is, in the embodiment of FIG. 3A, the reflective member 13 is on the first electrode 111. As shown in FIG. 3B, the second surface S132 of the reflective member 13 is in contact with the first electrode 111, while the first surface S131 is not in contact with the first electrode 111. That is, in the embodiment of FIG. 3B, the reflective member 13 is under the first electrode 111. As shown in FIG. 3C, the first surface S131 and the second surface S132 of the opaque portion 12 are both in contact with the first electrode 111. That is, in the embodiment of FIG. 3C, the reflective member 13 is in the first electrode 111.

The reflective member 13 may include a reflective material. For example, the reflective member 13 may include at least one of the following: magnesium, silver, aluminum, or a mixture thereof. The first electrode 111 may include a transparent conductive material. For example, the first electrode 111 may include ITO. The second electrode 113 may include a reflective material. For example, the material of the second electrode 113 includes at least one of the following: magnesium, silver, aluminum, or a mixture thereof.

Figure 4:
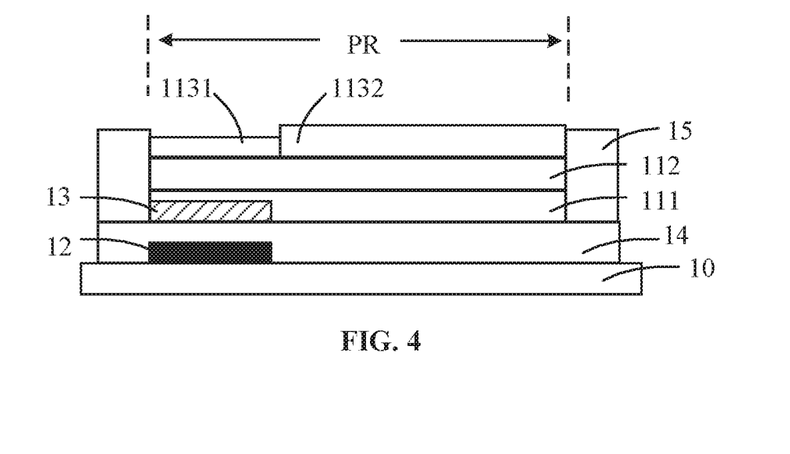
FIG. 4 is a schematic view of an array substrate according to an embodiment of the present disclosure.

FIG. 4 is a schematic view of an array substrate according to an embodiment of the present disclosure. As shown in FIG. 4, the second electrode 113 may include a first portion 1131 and a second portion 1132. The projection of the first portion 1131 on the first substrate 10 at least partially overlaps with the projection of the opaque portion 12 on the first substrate 10, and the first portion 1131 can partially transmit light from the light emitting layer 112. The projection of the second portion 1132 on the first substrate 10 does not overlap with the projection of the opaque portion 12 on the first substrate 10. Through such an array substrate, light emitted from the light emitting layer in a light-shielding region R1 can be partially emitted upward from the second electrode 113. Such an arrangement is advantageous to provide a convenient luminous intensity detection solution.

The first portion 1131 and the second portion 1132 may include the same material. The thickness of the first portion 1131 may be smaller than the thickness of the second portion 1132. Such an arrangement may enable the first portion 1131 to partially transmit light from the light emitting layer 112 compared to the second portion 1132. In some embodiments, the thickness of the first portion 1131 does not exceed 20 nm. For a reflective material, if the thickness exceeds 20 nm, it may be difficult to transmit light. In some embodiments, the first portion 1131 and the second portion 1132 may also include different materials.

As shown in FIG. 4, the array substrate according to an embodiment of the present disclosure further includes a planarization layer 14 between the opaque portion 12 and the first electrode 111, and a pixel definition layer 15 on a surface of the planarization layer 14 away from the first substrate 10. The pixel definition layer 15 is located on both sides of the first electrode 111 to define a pixel region PR of the array substrate. The opaque portion may include a thin film transistor.

An embodiment of the present disclosure also provides a display panel. The display panel may include an array substrate as described above.

Figure 5:
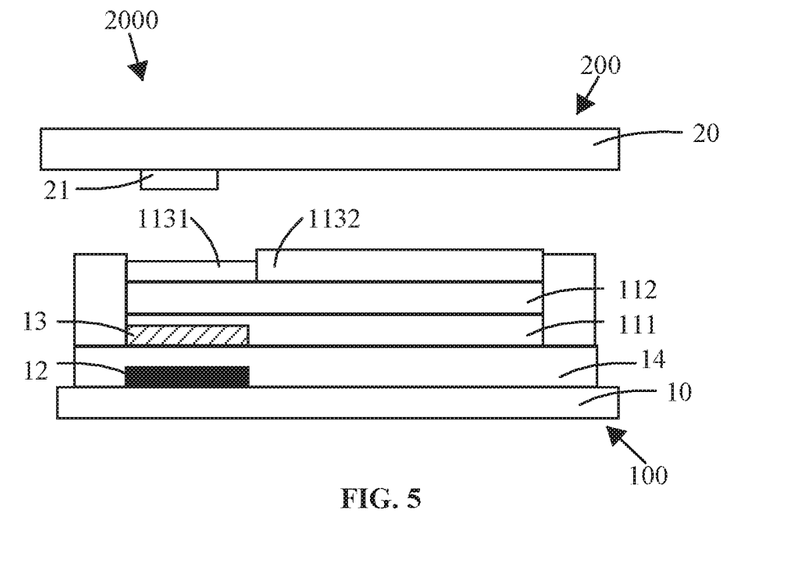
FIG. 5 is a schematic view of a display panel according to an embodiment of the present disclosure.

FIG. 5 is a schematic view of a display panel according to an embodiment of the present disclosure. As shown in FIG. 5, a display panel 2000 according to an embodiment of the present disclosure may include an array substrate 100. The array substrate may include an array substrate as shown in FIG. 1 or FIG. 4.

The display panel according to an embodiment of the present disclosure may further include a cover plate 200 disposed opposite to the array substrate 100. The display panel may be an OLED display panel.

As shown in FIG. 5, the cover plate 200 includes a second substrate 20 and a light detector 21 disposed on a surface of the second substrate 20 facing the array substrate 100. The projection of the light detector 21 on the first substrate 10 at least partially overlaps with the projection of the first portion 1131 of the second electrode 113 on the first substrate 10. The projection of the first portion 1131 on the first substrate 10 at least partially overlaps with the projection of the opaque portion 12 on the first substrate 10. The first portion 1131 can partially transmit light from the light emitting layer 112. With this arrangement, the light detector 21 can detect the light from the light emitting layer 112 that is emitted through the first portion 1131. The light detector 21 may include a PIN photoelectric conversion device.

Figure 6:
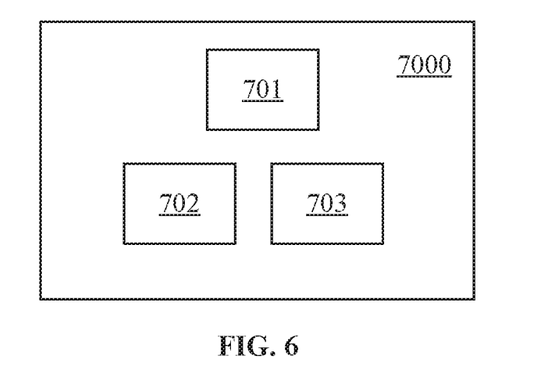
FIG. 6 is a schematic view of a display device according to an embodiment of the present disclosure.

FIG. 6 is a schematic view of a display device according to an embodiment of the present disclosure. As shown in FIG. 6, a display device 7000 according to an embodiment of the present disclosure includes a display panel 701, a data processing unit 702, and a light emitting control unit 703. The data processing unit 702 is configured to generate a control signal according to the brightness of the light emitting device detected by the light detector. The light emitting control unit 703 is configured to adjust the light emission brightness of the light emitting device according to a control signal.

The display panel 701 may be the display panel described above. For example, the display panel 701 may include a display panel as shown in FIG. 5. The data processing unit 702 and the light emitting control unit 703 may be implemented as a combination of a processor and a memory, wherein the processor executes a program stored in the memory to implement the function of a corresponding unit or module. The data processing unit 702 and the lighting control unit 703 can also be implemented in a complete hardware implementation, including an application specific integrated circuit (ASIC), a field programmable gate array (FPGA), and the like.

Figure 7A:
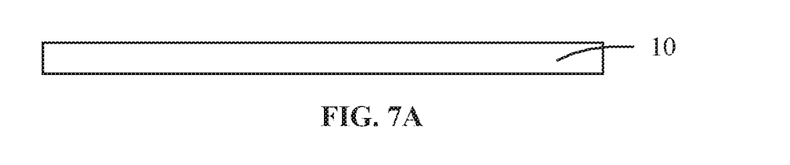
FIGS. 7A-7C are schematic flowcharts of a method for manufacturing an array substrate according to an embodiment of the present disclosure.
Figure 7B:
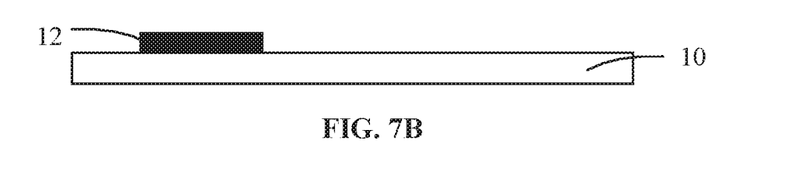
Figure 7C:
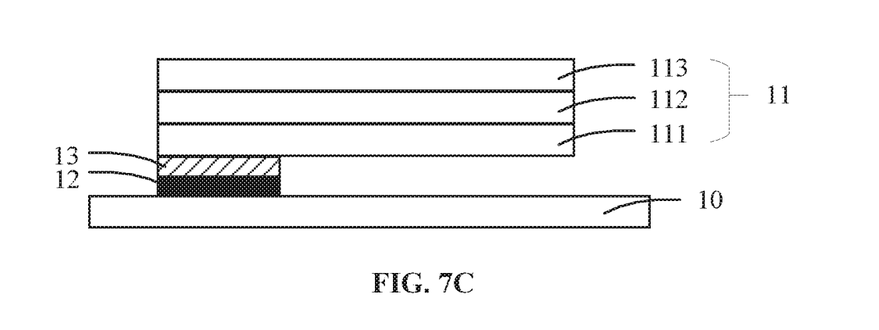

FIGS. 7A-7C are schematic flowcharts of a method for manufacturing an array substrate according to an embodiment of the present disclosure. In the embodiment shown in FIGS. 7A-7C, the method for manufacturing an array substrate includes:

S1. As shown in FIG. 7A, providing a first substrate 10;

S3. As shown in FIG. 7B, forming an opaque portion 12 on the first substrate 10;

S5. As shown in FIG. 7C, forming a light emitting device 11 and a reflective member 13 on the opaque portion 12. A projection of the light emitting device 11 on the first substrate 10 partially overlaps with a projection of the opaque portion 12 on the first substrate 10. The light emitting device 11 includes a first electrode 111, a light emitting layer 112, and a second electrode 113 sequentially disposed in a direction away from the first substrate 10. The first electrode 111 is transparent and the second electrode 113 is reflective. The reflective member 13 is located between the opaque portion 12 and the light emitting layer 112.

In some embodiments, forming the light emitting device 11 and the reflective member 13 on the opaque portion 12 includes: S511, forming the first electrode 111 on the opaque portion 12; S531, forming the reflective member 13 on the first electrode 111; S551, forming the light emitting layer 112 on the reflective member 13; and S571, forming the second electrode 113 on the light emitting layer 112. In such embodiments, the reflective member 13 is formed on the first electrode 111 (see FIG. 3A).

In some embodiments, forming the light emitting device 11 and the reflective member 13 on the opaque portion 12 includes: S512, forming a reflective member 13 on the opaque portion 12; S532, forming a first electrode 111 on the reflective member 13; S552. forming a light emitting layer 112 on the first electrode 111; and S572. forming the second electrode 113 on the light emitting layer 112. In such embodiments, the reflective member 13 is formed under the first electrode 111 (see FIG. 3B).

In some embodiments, forming the light emitting device 11 and the reflective member 13 on the opaque portion 12 includes: S503, forming a first sub-layer 1111 of a first electrode 111 on the opaque portion 12; S543, forming a second sub-layer 1112 of the first electrode 111 on the reflective member 13; S563, forming the light emitting layer 112 on the second sub-layer 1112; and S583, forming the second electrode 113 on the light emitting layer 112. In such embodiments, the reflective member 13 is in the first electrode 111 (see FIG. 3C).

According to some embodiments of the present disclosure, the reflective member 13 may be formed by a magnetron sputtering method. The reflective member 13 may include a reflective material. For example, the reflective member 13 may include any of magnesium, silver, aluminum, or a mixture thereof.

According to some embodiments of the present disclosure, the first electrode 111 may be formed using a magnetron sputtering method. The first electrode 111 may include a transparent conductive material. For example, the first electrode 111 may include ITO.

According to some embodiments of the present disclosure, the second electrode 113 may be formed using an evaporation method. The second electrode 113 may include a material having a relative high reflectance. For example, the material of the second electrode 113 may include any of magnesium, silver, aluminum, or a mixture thereof.

Figure 8A:
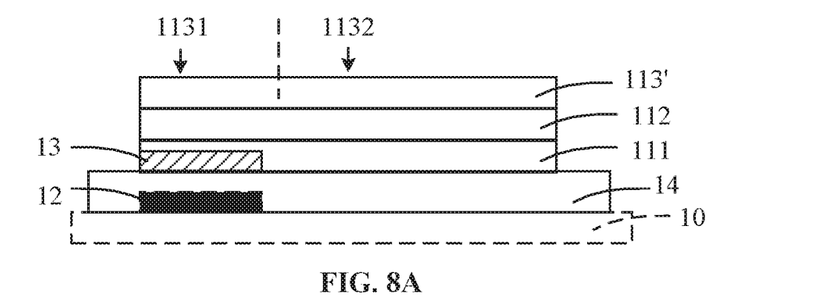
FIGS. 8A-8B are schematic views of a method of forming a second electrode of a light emitting device according to an embodiment of the present disclosure.
Figure 8B:
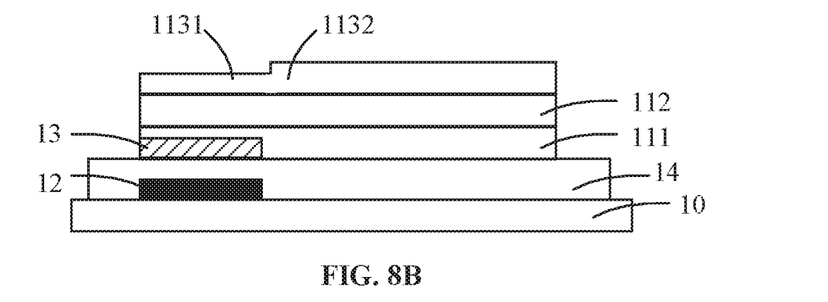

FIGS. 8A-8B are schematic views of a method of forming a second electrode of a light emitting device according to an embodiment of the present disclosure. As shown in FIGS. 8A-8B, a method of forming the second electrode 113 of the light emitting device 11 according to an embodiment of the present disclosure includes:

S10. As shown in FIG. 8A, forming a reflective conductive layer 113' on the light emitting layer 112. The reflective conductive layer 113' includes a first portion 1131 and a second portion 1132. A projection of the first portion 1131 on the first substrate 10 at least partially overlaps with a projection of the opaque portion 12 on the first substrate 10. A projection of the second portion 1132 on the first substrate 10 does not overlap with a projection of the opaque portion 12 on the first substrate 10.

S12. As shown in FIG. 8B, thinning the first portion 1131. By thinning a part of the first portion 1131, the thickness of the first portion 1131 is made smaller than that of the second portion 1132. Such an arrangement may enable the first portion 1131 to partially transmit the light from the light emitting layer 112 and the second portion 1132 to reflect the light from the light emitting layer 112. In some embodiments, the thickness of the first portion 1131 does not exceed 20 nm. If the thickness of the first portion 1131 exceeds 20 nm, the light transmittance of the first portion 1131 will be poor.

Figure 9A:
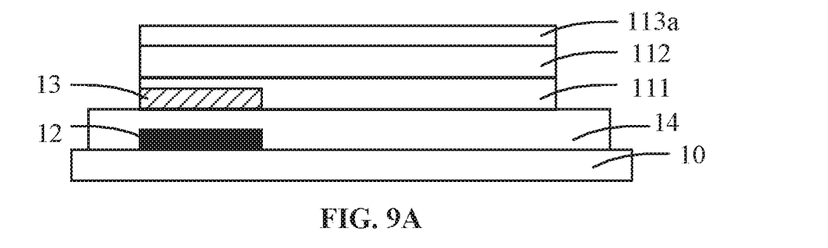
FIGS. 9A-9B are schematic views of a method of forming a second electrode of a light emitting device according to an embodiment of the present disclosure.
Figure 9B:
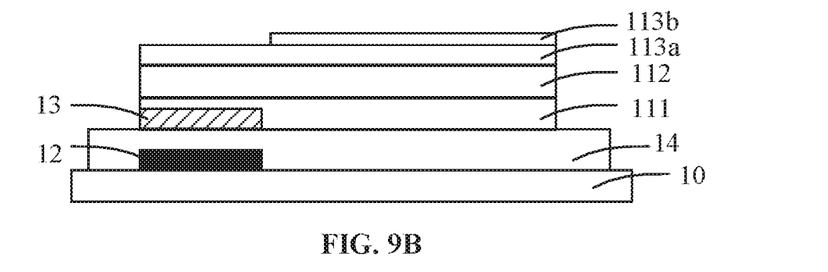

FIGS. 9A-9B are schematic views of a method of forming a second electrode of a light emitting device according to an embodiment of the present disclosure. As shown in FIGS. 9A-9B, a method of forming the second electrode 113 of the light emitting device 11 according to an embodiment of the present disclosure includes:

S20. As shown in FIG. 9A, forming a first reflective conductive layer 113a on the light emitting layer.

S22. As shown in FIG. 9B, forming a second reflective conductive layer 113b on the first reflective conductive layer 113a to form a second electrode 113. A projection of the second reflective conductive layer 113b on the first substrate 10 does not overlap with a projection of the opaque portion 12 on the first substrate 10.

Figure 10:
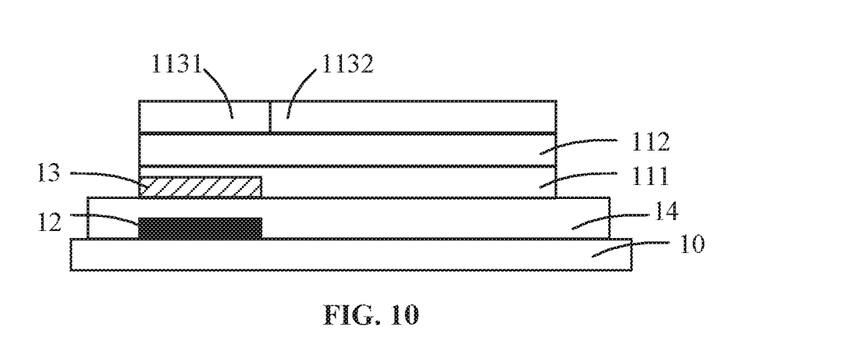
FIG. 10 is a schematic view of a method of forming a second electrode of a light emitting device according to an embodiment of the present disclosure.

FIG. 10 is a schematic view of a method of forming a second electrode of a light emitting device according to an embodiment of the present disclosure. As shown in FIG. 10, a method for forming the second electrode 113 of the light emitting device 11 according to an embodiment of the present disclosure includes:

S30. forming a first portion 1131 and a second portion 1132 on the light emitting layer 112. Materials of the first portion and the second portion are different. A projection of the first portion 1131 on the first substrate 10 at least partially overlaps with a projection of the opaque portion 12 on the first substrate 10. A projection of the second portion 1132 on the first substrate 10 does not overlap with a projection of the opaque portion 12 on the first substrate 10. The first portion is capable of partially transmitting light from the light emitting layer 112. In the embodiment shown in FIG. 10, the thicknesses of the first portion 1131 and the second portion 1132 may be the same or different.

The display device provided by the embodiments of the present disclosure may be any product or component having a display function, such as a display panel, a mobile phone, a tablet computer, a television, a notebook computer, a digital photo frame, a navigator, and the like.

The specific embodiments have been described, and are not intended to limit the scope of the disclosure. In fact, the novel embodiments described herein can be implemented in a variety of other forms. In addition, various omissions, substitutions, and changes in the form of the embodiments described herein may be made without departing from the spirit of the disclosure. The following claims and their equivalents are intended to cover such forms or modifications that fall within the scope and spirit of the disclosure.

What is claimed is:

1. An array substrate comprising:
    a first substrate;
    a light emitting device on the first substrate, the light emitting device comprising a first electrode, a light emitting layer, and a second electrode sequentially disposed in a direction away from the first substrate, wherein the first electrode is transparent, and wherein the second electrode is reflective, wherein the second electrode comprises a first portion and a second portion, wherein the first portion is capable of partially transmitting light from the light emitting layer, and wherein the second portion is capable of reflecting light from the light emitting layer;
    an opaque portion between the first substrate and the light emitting device, wherein a projection of the light emitting device on the first substrate partially overlaps with a projection of the opaque portion on the first substrate, wherein a projection of the first portion on the first substrate at least partially overlaps with the projection of the opaque portion on the first substrate, and wherein a projection of the second portion on the first substrate does not overlap with the projection of the opaque portion on the first substrate; and
    a reflective member between the opaque portion and the light emitting layer.

2. The array substrate according to claim 1, wherein the reflective member has a first surface facing the first substrate and a second surface away from the first substrate, and wherein at least one of the first surface and the second surface is in contact with the first electrode.

3. The array substrate according to claim 1, wherein the first portion and the second portion comprise a same material, and wherein a thickness of the first portion is less than a thickness of the second portion.

4. The array substrate according to claim 3, wherein the thickness of the first portion does not exceed 20 nm.

5. The array substrate according to claim 1, wherein the first portion and the second portion comprise different materials.

6. The array substrate according to claim 1, wherein a material of the second electrode comprises any of magnesium, silver, aluminum, or a mixture thereof.

7. The array substrate according to claim 1, wherein the opaque portion comprises a thin film transistor, and wherein the array substrate further comprises:
    a planarization layer between the thin film transistor and the first electrode; and
    a pixel definition layer on a surface of the planarization layer away from the first substrate, the pixel definition layers located on both sides of the first electrode to define a pixel region of the array substrate.

8. A display panel comprising the array substrate according to claim 1 and a cover plate disposed opposite to the array substrate.

9. The display panel according to claim 8, wherein the cover plate comprises a second substrate and a light detector disposed on a surface of the second substrate facing the array substrate, wherein a projection of the light detector on the first substrate at least partially overlaps with the projection of the first portion of the second electrode on the first substrate, wherein the projection of the first portion on the first substrate at least partially overlaps with the projection of the opaque portion on the first substrate, and wherein the first portion is capable of partially transmitting light from the light emitting layer.

10. The display panel according to claim 9, wherein the light detector comprises a PIN photoelectric conversion device.

11. A display device comprising:
    the display panel according to claim 9;
    a data processing unit configured to generate a control signal according to a brightness of the light emitting device detected by the light detector; and
    a light emitting control unit configured to adjust the brightness of the light emitting device according to the control signal.

12. A display device comprising:
    the display panel according to claim 10;
    a data processing unit configured to generate a control signal according to a brightness of the light emitting device detected by the light detector; and
    a light emitting control unit configured to adjust the brightness of the light emitting device according to the control signal.

* * * * *